(12) United States Patent
Song

(10) Patent No.: US 10,224,960 B2
(45) Date of Patent: Mar. 5, 2019

(54) MEMORY DEVICE WITH ERROR CHECK FUNCTION OF MEMORY CELL ARRAY AND MEMORY MODULE INCLUDING THE SAME

(71) Applicant: Samsung Electronics Co., Ltd., Suwon-si (KR)

(72) Inventor: Won-Hyung Song, Osan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/683,505

(22) Filed: Aug. 22, 2017

(65) Prior Publication Data
US 2018/0083651 A1   Mar. 22, 2018

(30) Foreign Application Priority Data
Sep. 19, 2016 (KR) .......................... 10-2016-0119396

(51) Int. Cl.
| | | |
|---|---|---|
| G11C 7/06 | (2006.01) | |
| H03M 13/09 | (2006.01) | |
| G06F 11/10 | (2006.01) | |
| G11C 7/10 | (2006.01) | |
| G11C 11/4076 | (2006.01) | |
| G11C 29/52 | (2006.01) | |
| H03M 13/15 | (2006.01) | |
| H03M 13/29 | (2006.01) | |
| G11C 5/04 | (2006.01) | |
| G11C 29/04 | (2006.01) | |

(52) U.S. Cl.
CPC ....... *H03M 13/095* (2013.01); *G06F 11/1048* (2013.01); *G11C 7/1045* (2013.01); *G11C 11/4076* (2013.01); *G11C 29/52* (2013.01); *H03M 13/151* (2013.01); *H03M 13/2906* (2013.01); *G11C 5/04* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 4,920,539 A | 4/1990 | Albonesi | |
| 6,732,291 B1 | 5/2004 | Kilmer et al. | |
| 8,312,321 B2 | 11/2012 | Higashijima et al. | |
| 8,811,065 B2 | 8/2014 | Rajan et al. | |
| 9,142,323 B1 | 9/2015 | Lee et al. | |
| 9,432,298 B1 * | 8/2016 | Smith | ................ H04L 49/9057 |

(Continued)

*Primary Examiner* — Son Dinh
*Assistant Examiner* — Sultana Begum
(74) *Attorney, Agent, or Firm* — Muir Patent Law, PLLC

(57) ABSTRACT

A memory device that checks an error of a memory cell and a memory module including the same are disclosed. The memory module includes a first memory device and a second memory device. The first memory device includes a first area in which normal data are stored, and a second area in which error check data are stored. The second memory device stores reliability information about the normal data that is stored in the first area of the first memory device. The first memory device outputs a result of comparing the normal data read from the first area of the first memory device to the error check data read from the second area of the first memory device.

14 Claims, 13 Drawing Sheets

(56) References Cited

U.S. PATENT DOCUMENTS

| | | |
|---|---|---|
| 2014/0325311 A1 | 10/2014 | Lo et al. |
| 2015/0363248 A1 | 12/2015 | D'Abreu |
| 2016/0085443 A1* | 3/2016 | Tomishima .......... G11C 7/1006 711/114 |
| 2016/0179596 A1 | 6/2016 | Kim |

* cited by examiner

MEMORY DEVICE WITH ERROR CHECK FUNCTION OF MEMORY CELL ARRAY AND MEMORY MODULE INCLUDING THE SAME

CROSS-REFERENCE TO RELATED APPLICATIONS

This application claims priority under 35 U.S.C. § 119 to Korean Patent Application No. 10-2016-0119396 filed on Sep. 19, 2016, in the Korean Intellectual Property Office, the entire contents of which are hereby incorporated by reference.

BACKGROUND

Embodiments of the present disclosure relate to a memory device and a memory module, and more particularly, to a memory device checking an error of a memory cell and a memory module including the same.

Memory devices are being widely used in electronic devices such as a mobile device and a computer. Memory cells of memory devices are being miniaturized more and more as manufacturing process technologies develop. The miniaturization of memory cells may cause an increase in defective memory cells.

To repair with the occurrence of defective memory cells, a memory device may further include redundant memory cells therein. Additionally, to recover data of defective memory cells, a host using the memory device may include an error correction circuit therein. The host may perform an error correction operation by using an error correction code. The host may use additional memory devices to store the result (e.g., parity bits) of the error correction operation. To this end, a memory module may include the additional memory devices to store the parity bits. However, the additional memory devices increase a price of the memory module and a product including the memory module. Accordingly, there is a need for a memory module that includes fewer additional memory devices.

SUMMARY

Various embodiments of the present disclosure provide a memory device that checks an error of a memory cell and a memory module including the same.

According to an aspect of an embodiment, a memory module includes one or more first memory devices and one or more second memory devices. The first memory devices each includes a first area in which normal data are stored, and a second area in which error check data are stored. The second memory devices store reliability information about the normal data that is stored in the first area of each of the first memory devices. Each of the first memory devices outputs a result of comparing the normal data read from the first area for that first memory device to the error check data read from the second area for that first memory device.

According to another aspect of an embodiment, a memory device includes one or more input/output pads, a memory cell array, a register, and a comparator. The one or more input/output pads receive target data or error check data from a host. The memory cell array stores the target data. The register stores the error check data. The comparator compares the target data read from the memory cell array to the error check data stored in the register. The comparison result of the comparator is output to the host through the one or more input/output pads under control of the host.

According to still another aspect of an embodiment, an electronic device includes a first memory device. The first memory device includes one or more input/output pads configured to receive a first data or a second data from outside the first memory device, a memory cell array including a plurality of memory cells and configured to store the first data, and an error checking function circuit connected to the memory cell array and configured to store the second data, compare the first data stored in the memory cell array to the second data, and selectively output the first data, the second data, or a comparison result between the first and second data through the one or more input/output pads.

DETAILED DESCRIPTION

Below, various embodiments of the present disclosure may be described in detail and clearly to such an extent that an ordinary one in the art easily implements the inventive concept.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

Figure 1:
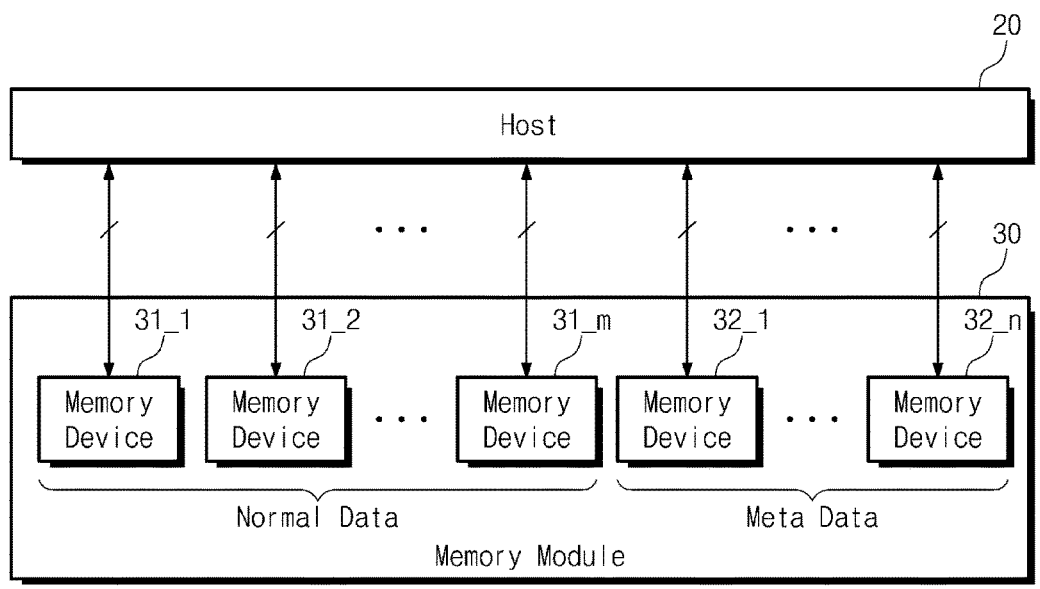
FIG. 1 is a block diagram illustrating a computer system according to example embodiments.

FIG. 1 is a block diagram illustrating a computer system according to example embodiments.

Referring to FIG. 1, a computer system 10 may include a host 20 and a memory module 30. The host 20 may drive elements and an operating system of the computer system 10. In an embodiment, the host 20 may include controllers to control elements of the computer system 10, interfaces, graphics engines, etc. In an embodiment, the host 20 may include a central processing unit (CPU), a graphic processing unit (GPU), a system on chip (SoC), an application processor (AP), etc.

The memory module 30 may exchange data with the host 20. The memory module 30 may operate as a main memory, a working memory, a buffer memory, a cache memory, or a storage memory of the computer system 10.

The memory module 30 may include memory devices 31_1 to 31_m and 32_1 to 32_n. For productivity of the memory module 30, the memory devices 31_1 to 31_m and 32_1 to 32_n may be implemented to have the same structure. For example, a plurality of integrated circuits may be formed on a wafer to manufacture each of the memory devices 31_1 to 31_m and 32_1 to 32_n, such as a memory chip. Each of the memory devices 31_1 to 31_m and 32_1 to 32_n may include integrated circuits formed by memory manufacturing processes. The memory devices 31_1 to 31_m and 32_1 to 32_n, such as memory chips may be two-dimensionally arranged on a top surface of the same semiconductor wafer.

Figure 2:
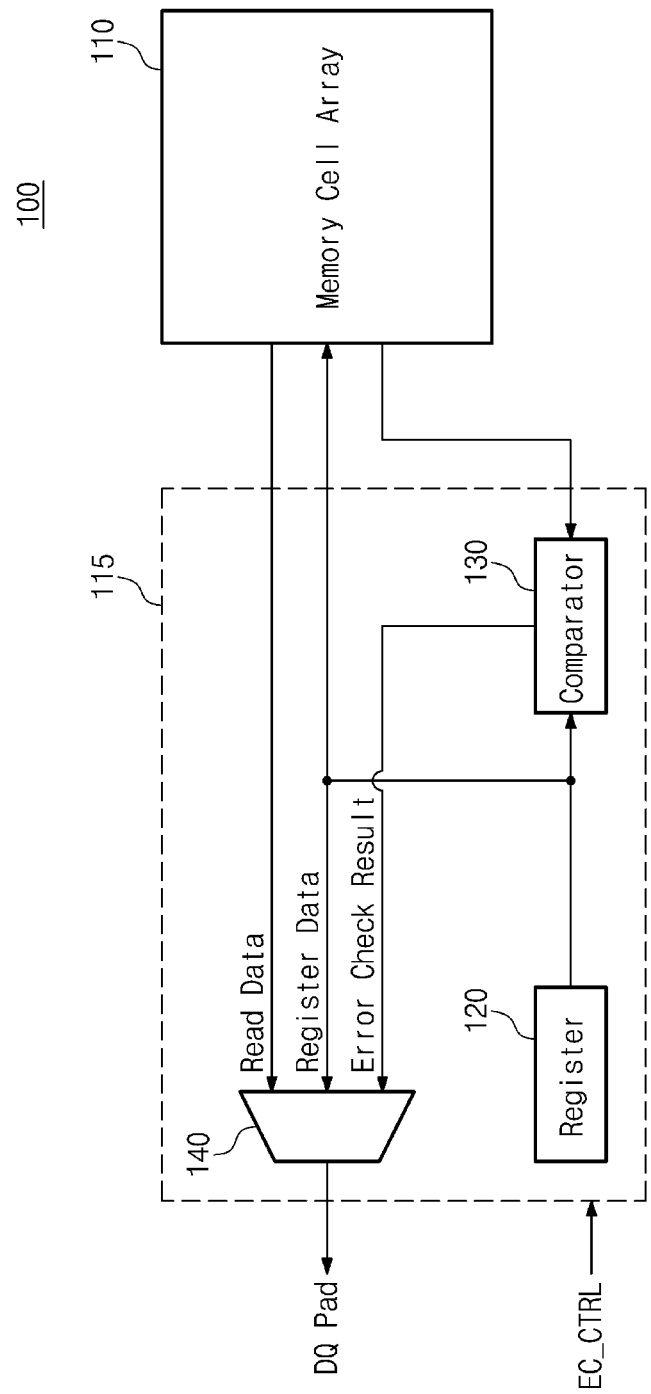
FIG. 2 is a block diagram illustrating a memory device according to example embodiments.
Figure 3:
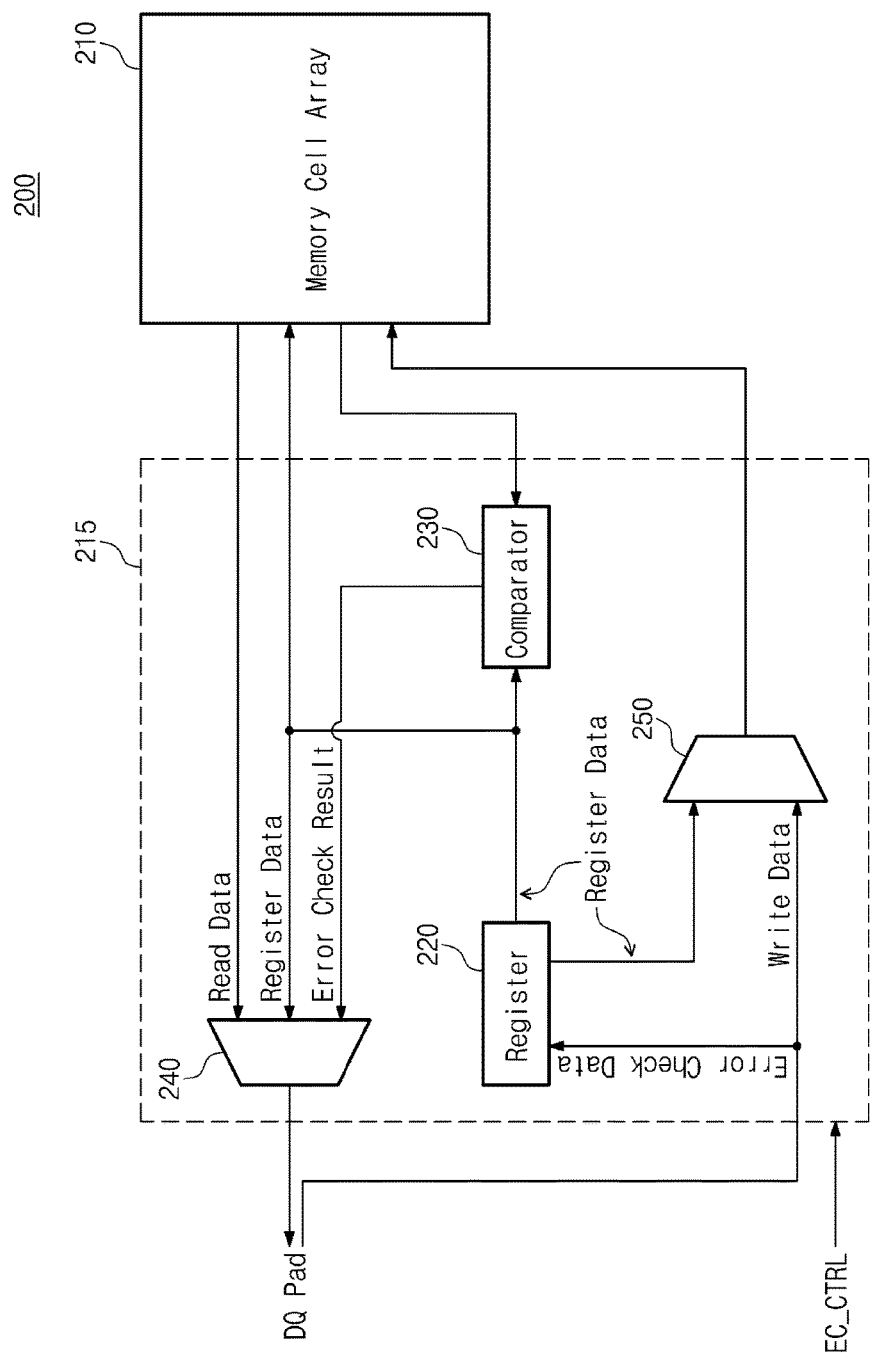
FIG. 3 is a block diagram illustrating a memory device according to example embodiments.
Figure 4:
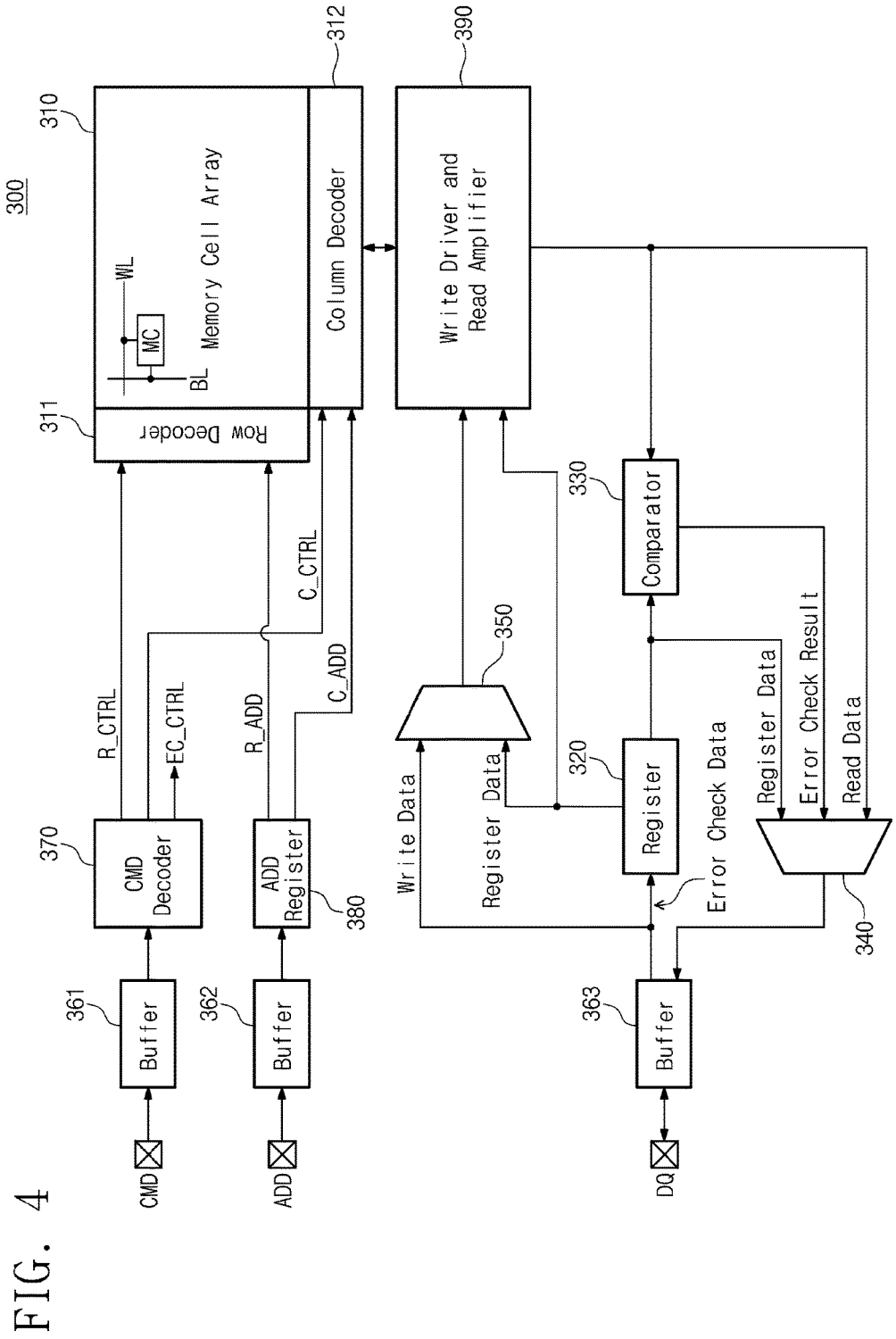
FIG. 4 is a block diagram illustrating a memory device according to example embodiments.

As used herein, a memory device may refer to any of the various devices such as shown in FIGS. 2-4, and may also refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these memory devices, but may additionally include products that include these devices, such as a memory module, memory card, hard drive including additional components, or a mobile phone, laptop, tablet, desktop, camera, or other consumer electronic device, etc.

A memory device may include a plurality of memory cells. As a process is scaled down, the memory device may include memory cells in which errors may easily be generated. The errors may be roughly classified into a hard error and a soft error. The hard error may mean a case where one or more memory cells are hardwarely damaged. The soft error may mean a case where one or more memory cells are not hardwarely damaged but data of the memory cells temporarily transitions due to alpha particles and so on. In addition, an error may be generated due to insufficient margin.

To overcome various kinds of errors of the memory device above described, the memory devices 31_1 to 31_m and 32_1 to 32_n are divided into a plurality of first memory devices 31_1 to 31_m and a plurality of second memory devices 32_1 to 32_n. In example embodiments, normal data may be stored in the first memory devices 31_1 to 31_m and meta data may be stored in the second memory devices 32_1 to 32_n.

Here, the normal data may mean data which are stored in the first memory devices 31_1 to 31_m transmitted from the host 20 or output from the first memory devices 31_1 to 31_m to the host 20. The metadata may mean data associated with the normal data stored in the first memory devices 31_1 to 31_m. For example, the metadata may include reliability information of the normal data. In more detail, the reliability information may include a result (e.g., parity bits) that is obtained by error correction operation. For example, the reliability information may include error-correcting code (ECC).

Referring to FIG. 1, the number of the first memory devices 31_1 to 31_m is "m", and the number of the second memory devices 32_1 to 32_n is "n". Values of "m" and "n" may be determined by the specification that defines data communication between the host 20 and the memory module 30. For example, it is assumed that the size of normal data is $2^k$. In general, (k+1) data bits are additionally needed to correct a 1-bit error of $2^k$ data bits. That is, the (k+1)-bit data may be the metadata. The $2^k$-bit data (i.e., normal data) may be stored in the first memory devices 31_1 to 31_m. The (k+1)-bit data (i.e., metadata) may be stored in the second memory devices 32_1 to 32_n. The host 20 may correct an error generated from $2^k$-bit data based on the (k+1)-bit data. To this end, the (k+1)-bit data may include information about whether an error is generated and a location of an error.

In an embodiment, it is assumed that each of the memory devices 31_1 to 31_m and 32_1 to 32_n operates in an x4 mode. Here, the x4 mode may mean that four DQ pads (input/output pads) are used for data input/output. However, a mode of operation of the memory device according to an embodiment of the inventive concept is not limited to the above description. The memory device may operate in various modes such as x8, x16, x32, x64, x1024, etc. It is assumed that normal data has the size of 64 bits ($2^6$). Metadata of 7 (6+1) bits are needed to recover the failed normal data. To store 64-bit data and 7-bit data, the number of the first memory devices 31_1 to 31_m that are necessary is 16 (e.g., x4×16=x64), and the number of the second memory devices 32_1 to 32_n that are necessary is 2 (e.g., x4×2=x8). The two second memory devices 32_1 and 32_2 are needed to store metadata of 7 bits or more. Accordingly, the memory module 30 may use the two second memory devices 32_1 and 32_2 for metadata input/output.

In short, the memory module 30 may include a total of 18 memory devices 31_1 to 31_16, 32_1, and 32_2, the sixteen first memory devices 31_1 to 31_16 may be used for normal data input/output, and the two second memory devices 32_1 and 32_2 may be used for metadata input/output. To correct a 1-bit error with respect to 64-bit data, there is a need for metadata of which the size corresponds to about 11% ($\approx 7/64$) of 64 bits. That is, the memory module 30 may further include the two second memory devices 32_1 and 32_2 to improve reliability of the sixteen first memory devices 31_1 to 31_16. Since the memory devices operate in the x4 mode and are identically implemented, practically, a rate of memory devices used for metadata may be 12.5% (=2/16).

In another embodiment, it is assumed that each of the memory devices 31_1 to 31_m and 32_1 to 32_n operates in the x4 mode. It is assumed that normal data has the size of 32 bits ($2^5$). Metadata of 6 (5+1) bits are needed to recover the failed normal data. To store 32-bit data and 6-bit data, the number of the first memory devices 31_1 to 31_*m* that are necessary is 8 (e.g., x4×8=x32), and the number of the second memory devices 32_1 to 32_*n* that are necessary is 2 (e.g., x4×2=x8). The two second memory devices 32_1 and 32_2 are needed to store metadata of 6 bits or more. Accordingly, the memory module 30 may use the two second memory devices 32_1 and 32_2 for metadata input/output.

In short, the memory module 30 may include a total of 10 memory devices 31_1 to 31_8, 32_1, and 32_2. The eight first memory devices 31_1 to 31_8 may be used for normal data input/output, and the two second memory devices 32_1 and 32_2 may be used for metadata input/output. To correct a 1-bit error with respect to 32-bit data, there is a need for metadata of which the size corresponds to about 18.75% (≈6/32) of 32 bits. That is, the memory module 30 may further include the two second memory devices 32_1 and 32_2 to improve reliability of the eight first memory devices 31_1 to 31_8. Since the memory devices operate in the x4 mode and are identically implemented, practically, a rate of memory devices used for metadata may be 25% (=2/8).

The following table shows a normal data size, a metadata size, the number of first memory devices, the number of second memory devices, and a ratio of the number of second memory devices to the number of first memory devices. However, embodiments of the inventive concept are not limited to cases to be described with reference to table 1.

TABLE 1

| x4 Mode | Normal data size | Meta data size | Number of first memory device | Number of second memory device | Ratio |
|---|---|---|---|---|---|
| Case 1 | 16 bit ($2^4$) | 5 bit (4 + 1) | 4 ea (16/4) | 2 ea (4 × 2 > 5) | 50% (2/4) |
| Case 2 | 32 bit ($2^5$) | 6 bit (5 + 1) | 8 ea (32/4) | 2 ea (4 × 2 > 6) | 25% (2/8) |
| Case 3 | 64 bit ($2^6$) | 7 bit (6 + 1) | 16 ea (64/4) | 2 ea (4 × 2 > 7) | 12.5% (2/16) |
| Case 4 | 128 bit ($2^7$) | 8 bit (7 + 1) | 32 ea (128/4) | 2 ea (4 × 2 = 8) | 6.25% (2/32) |

Referring to table 1, a ratio of the number of second memory devices to the number of first memory devices may increase more and more as the size of normal data becomes smaller. The second memory devices may mean memory devices that are additionally used for reliability of the first memory devices. Accordingly, since a ratio of the number of second memory devices to the number of first memory devices may increase more and more as the size of normal data becomes smaller, the efficiency of the area of the memory module 30 may decrease.

According to an embodiment of the inventive concept, a ratio of the number of second memory devices to the number of first memory devices may be improved. The memory device according to an embodiment of the inventive concept may output, to the host 20, whether an error exists in internal memory cells, under control of the host 20. According to an embodiment of the inventive concept, the host 20 may check whether an error exists in data stored in first memory devices, by performing parity calculation by using data stored in second memory devices of the memory module 30. Afterwards, the host 20 may check whether an error exists in any memory device among the first and second memory devices of the memory module 30. Next, the host 20 may perform an error correction operation.

As described above, in general, (k+1)-bit data (metadata) are additionally needed to correct a 1-bit error of $2^k$-bit data (normal data). To correct an error, the (k+1)-bit data may include information about whether an error is generated and a location of an error. However, the memory device according to an embodiment of the inventive concept can inform the host 20 whether an error exists in internal memory cells, under control of the host 20. Accordingly, the size of metadata may be smaller than a size corresponding to (k+1) bits. According to an embodiment of the inventive concept, in cases of table 1, the number of second memory devices may be reduced to "1". That is, a ratio of the number of second memory devices to the number of first memory devices may be improved.

FIG. 2 is a block diagram illustrating a memory device according to example embodiments. FIG. 2 will be described with reference to FIG. 1.

Referring to FIG. 2, a memory device 100 may correspond to each of the memory devices 31_1 to 31_*m* and 32_1 to 32_*n* illustrated in FIG. 1. The memory device 100 may include a memory cell array 110 and an error check function circuit 115. The error check function circuit 115 may include a register 120, a comparator 130, and a read multiplexer 140.

The memory cell array 110 may include a plurality of memory cells (not illustrated). Each memory cell may be a volatile memory cell. For example, each memory cell may be a dynamic random access memory (DRAM) cell, a static random access memory (SRAM) cell, etc. Each memory cell may be a non-volatile memory cell. For example, each memory cell may be a NOR flash memory cell, a NAND flash memory cell, a ferroelectric random access memory (FRAM) cell, a phase change random access memory (PRAM) cell, a thyristor random access memory (TRAM) cell, a magnetic random access memory (MRAM), cell, a resistive random access memory (RRAM) cell, etc. Referring to FIG. 2, one memory cell array 100 is illustrated, but the number of memory cell arrays 110 is not limited thereto.

The register 120 may store register data. Here, the register data may mean data that are defined in advance. Also, the register data may mean data used to check the reliability of the memory cell array 110, that is, error check data. In more detail, the register data may mean data to check whether a hard error, soft error, or an error due to insufficient margin is generated in a memory cell (not illustrated). That is, the register data are distinguished from the above-described metadata. To this end, the register 120 may be implemented in an area that is logically or physically distinguished from the memory cell array 110. In another embodiment, the register 120 may be implemented with any area of the memory cell array 110, which is logically distinguished.

In example embodiments, the register 120 may include a memory cell such as a DRAM cell, a SRAM cell, a NOR flash memory cell, a NAND flash memory cell, a FRAM cell, a PRAM cell, a TRAM cell, an MRAM cell, an RRAM cell, etc. In one embodiment, the register may include memory cells different type of memory cells from the memory cell array 110. For example, the memory cell array 110 includes DRAM cells and the register 120 includes one of SRAM cells, MRAM cells and PRAM cells.

The register 120 may be connected with the memory cell array 110, the comparator 130, and the read multiplexer 140.

Under control of the host 20 (refer to FIG. 1), the register 120 may provide register data to the memory cell array 110, the comparator 130 or the read multiplexer 140.

The comparator 130 may compare data (read data) received from the memory cell array 110 to the register data. The comparator 130 may output the comparison result to the read multiplexer 140. In more detail, the comparator 130 may check whether data stored in the memory cell array 110 is the same as data stored in the register 120. To this end, the comparator 130 may be implemented with various logical circuits (e.g., AND, NAND, OR, NOR, XOR, XNOR, etc.). In addition, data stored in the memory cell array 110 may mean write data that is previously received from the host 20. For example, target data may mean all kinds of data that are stored in or output from the memory cell array 110 to check whether an error exists in the memory cell array 110. In more detail, the host 20 may transmit data to be stored in the memory cell array 110 to the memory device 100 for error check. Alternatively, in response to an error check command of the host 20, the memory device 100 may transmit the register data to the memory cell array 110. The data transmitted to the memory cell array 110 may be viewed as the target data. In another aspect, to check whether an error is generated in the memory cell array 110, data that is transmitted from the memory cell array 110 to the comparator 130 may be viewed as the target data.

The read multiplexer 140 may be connected with the memory cell array 110, the register 120, and the comparator 130. The read multiplexer 140 may select one of read data, an error check result, and the register data based on a command of the host 20. The selected result or data may be output to the host 20 through a DQ pad (an input/output pad). Below, a case where the error check result, the read data, or the register data are selected will be described.

When a read operation of the memory device 100 is performed, the read multiplexer 140 may select read data. This case corresponds to a case where the host 20 transmits a read command to the memory device 100. Accordingly, the read data may mean data that are read from the memory cell array 110.

When the host 20 transmits an error check command EC for any address of the memory cell array 110 to the memory device 100, the read multiplexer 140 may select the error check result. Here, the error check command EC may be a command generated by the host 20 to check whether an error exists in the memory cell array 110. The error check result may mean a comparison result of the comparator 130. The host 20 may check whether an error exists in any memory device of the memory devices 31_1 to 31_m and 32_1 to 32_n (refer to FIG. 1) of the memory module 30 (refer to FIG. 1) with reference to the error check result. In one example embodiment, the host 20 may check an error location through the error check result and may perform an error correction operation based on the checked error location.

Under control of the host 20, the read multiplexer 140 may select the register data of the register 120. The host 20 may transmit a command for checking the register data (that is, data defined in advance). Afterwards, after the host 20 checks the register data, the host 20 may newly define the register data or may maintain the register data without modification. The above-described operation may be performed independently of operations that are performed according to the read command or the error check command.

Referring to FIG. 2, the register 120, the comparator 130, and the read multiplexer 140 may operate in response to an error check control signal EC_CTRL that is generated based on the error check command EC. The generation of the error check control signal EC_CTRL and an operation that is performed according to the error check control signal EC_CTRL will be described in detail with reference to FIG. 4.

FIG. 3 is a block diagram illustrating a memory device according to example embodiments. FIG. 3 will be described with reference to FIGS. 1 and 2.

Referring to FIG. 3, a memory device 200 may include a memory cell array 210 and an error check function circuit 215. The error check function circuit 215 may include a register 220, a comparator 230, a read multiplexer 240, and a write multiplexer 250. The memory cell array 210, the register 220, the comparator 230, and the read multiplexer 240 are described with reference to FIG. 2, and a detailed description thereof is thus omitted.

The write multiplexer 250 may be connected with the memory cell array 210 and the register 220. The write multiplexer 250 may select either write data or register data based on a command of the host 20 (refer to FIG. 1). The selected data may be output to the memory cell array 210. Below, a case where the write data or the register data are selected will be described respectively.

When a write operation of the memory device 200 is performed, the write multiplexer 250 may select the write data. This case corresponds to a case where the host 20 transmits a write command to the memory device 200. Accordingly, the write data may mean data that are transmitted from the host 20 through a DQ pad (input/output pad). The selected write data may be transmitted to the memory cell array 210.

The host 20 may transmit the error check command for any address to the memory device 200. Unlike that described with reference to FIG. 2, the host 20 may transmit error check data to the memory device 200 together with the error check command EC. In this case, the write multiplexer 250 may select the register data. That is, the error check data may be first stored in the register 220, and the register data may be transmitted to the write multiplexer 250. Accordingly, the host 20 may update or define the register data newly. Afterwards, the register data may be transferred to the comparator 230 and may be used to check whether an error exists in the memory cell array 210.

Referring to FIG. 3, the register 220, the comparator 230, the read multiplexer 240, and the write multiplexer 250 may operate in response to the error check control signal EC_CTRL that is generated based on the error check command EC. The generation of the error check control signal EC_CTRL and an operation that is performed according to the error check control signal EC_CTRL will be described in detail with reference to FIG. 4.

Below, a case where the host 20 performs data input/output with the memory module 30 including the memory device 200 according to example embodiments will be described. The host 20 may detect an error from data received from the memory module 30 while exchanging data with the memory module 30. This means a case where write data are transmitted from the host 20 to the memory module 30 but an error is generated in the write data stored in the memory module 30. To correct the error, the host 20 may newly transmit the error check command to the memory module 30 and may also retransmit the write data thereto. That is, the above-described error check data may mean write data transmitted prior to the error check command, that is, original data. However, example embodiments of the inventive concept are not limited thereto. For example, the error check data may be any data that are transmitted to the memory module 30 by the host 20 to check reliability of the memory module 30. The host 20 may check whether an error exists in any memory device of the memory devices 31_1 to 31_m and 32_1 to 32_n of the memory module 30, based on the error check data. Next, the host 20 may perform an error correction operation. According to an embodiment of the inventive concept, it may be possible to correct all the above-described errors: the hard error, the soft error, and the error due to insufficient margin.

FIG. 4 is a block diagram illustrating a memory device according to example embodiments. FIG. 4 will be described with reference to FIGS. 1 to 3.

Referring to FIG. 4, a memory device 300 may include a memory cell array 310, a row decoder 311, a column decoder 312, a register 320, a comparator 330, a read multiplexer 340, a write multiplexer 350, first to third buffers 361 to 363, a command decoder 370, an address register 380, and a write driver and read amplifier 390. However, for ease of illustration, elements other than the above-described elements are not illustrated. Also, the memory cell array 310, the register 320, the comparator 330, the read multiplexer 340, and the write multiplexer 350 are described with reference to FIGS. 2 and 3, and a detailed description thereof is thus omitted.

The memory cell array 310 may include a word line WL, a bit line BL, and a memory cell connected to the word line WL and the bit line BL. One word line WL, one bit line BL, and one memory cell MC are illustrated in FIG. 4. However, the number of word lines, the number of bit lines, and the number of memory cells are not limited thereto.

The row decoder 311 may be connected with the memory cell array 310. In more detail, the row decoder 311 may control the word line WL in the memory cell array 310. Although not illustrated in FIG. 4, a plurality of word lines may be arranged in the memory cell array 310, and the row decoder 311 may select at least one of the word lines.

The column decoder 312 may be connected with the memory cell array 310. In more detail, the column decoder 312 may control the bit line BL in the memory cell array 310. Although not illustrated in FIG. 4, a plurality of bit lines may be arranged in the memory cell array 310, and the column decoder 312 may select at least one of the bit lines.

The first buffer 361 may receive a command CMD from the outside and may transmit the received command CMD to the command decoder 370. The first buffer 361 may be connected with a command pad. The second buffer 362 may receive an address ADD from the outside and may transmit the received address ADD to the address register 380. The second buffer 362 may be connected with an address pad. The third buffer 363 may receive write data from the outside or may transmit read data to the outside. The third buffer 363 may be connected with a DQ pad (input/output pad). Here, the numbers of the first to third buffers 361 to 363 are not limited to those illustrated in FIG. 4.

The host 20 (refer to FIG. 1) may transmit write data or error check data to the third buffer 363 through the DQ pad. Afterwards, the third buffer 363 may transmit the write data to the write multiplexer 350. The third buffer 363 may transmit the error check data to the write multiplexer 350 or the register 320.

The host 20 may receive the read data or the error check result through the DQ pad. To this end, the third buffer 363 may receive read data stored in the memory cell array 310, the error check result, or register data through the read multiplexer 340. The third buffer 363 may transmit the read data, the register data, or the error check result to the host 20 through the DQ pad.

The command decoder 370 may receive a command from the host 20. In more detail, the command decoder 370 may receive a command through the command pad and the first buffer 361. The command decoder 370 may generate a row decoder control signal R_CTRL, a column decoder control signal C_CTRL, or the error check control signal EC_CTRL with reference to the received command. The generated row decoder control signal R_CTRL may be transmitted to the row decoder 311. The generated column decoder control signal C_CTRL may be transmitted to the column decoder 312. The generated error check control signal EC_CTRL may be transmitted to all or some of elements of the memory device 300.

The address register 380 may receive an address from the host 20. In more detail, the address register 380 may receive an address through the address pad and the second buffer 362. The address register 380 may temporarily store the received address. Afterwards, the address register 380 may generate a row address R_ADD or a column address C_ADD based on an operation of the memory device 300. The generated row address R_ADD may be transmitted to the row decoder 311. The generated column address C_ADD may be transmitted to the column decoder 312.

The write driver and read amplifier 390 may write data in the memory cell array 310 or may read data from the memory cell array 310. In more detail, in a case where a write operation or a read operation of the memory device 300 is performed, any bit line may be selected by the column decoder 312. Afterwards, the write driver 390 may write data in a memory cell connected to the selected bit line. The read amplifier 390 may sense data stored in a memory cell connected to the selected bit line and may amplify the sensed result.

The write driver 390 may receive the write data or the register data from the write multiplexer 350. The read amplifier 390 may transmit the read data to the read multiplexer 340 or the target data to the comparator 330.

Referring to FIG. 4, the memory device 300 is illustrated as including one for each element. However, embodiments of the inventive concept are not limited thereto. For example, each element may include two or more elements. In more detail, each of the register 320, the comparator 330, the read multiplexer 340, and the write multiplexer 350 may be provided for each DQ pad.

Below, an operation in which the memory device 300 processes the error check command received from the host 20 will be described. The host 20 may send the error check command and any address to the memory device 300 or may send the error check command, any address, and the error check data to the memory device 300.

In an embodiment, it is assumed that the host 20 transmits the error check command and any address to the memory device 300. The command decoder 370 may generate the error check control signal EC_CTRL by decoding the received error check command. The register 320 may transmit the register data to the write driver and read amplifier 390 in response to the error check control signal EC_CTRL. The write driver 390 may store the register data in a memory cell corresponding to any address. The memory cell corresponding to any address may be selected by the row decoder 311 and the column decoder 312. After data defined in advance are stored in the memory cell corresponding to any address, the read amplifier 390 may read data stored in the memory cell. The comparator 330 may compare data from the read amplifier 390 to the register data stored in the register 320 and may transmit the comparison result to the read multiplexer 340. The comparison result may be transmitted to the host 20 through the third buffer 363 and the DQ pad. That is, the host 20 may directly check whether an error exists in the memory cell corresponding to any address.

In another embodiment, it is assumed that the host 20 transmits the error check command, any address, and the error check data to the memory device 300. The command decoder 370 may generate the error check control signal EC_CTRL by decoding the error check command. The register 320 may store the register data (i.e., the error check data) in response to the error check control signal EC_CTRL. The write multiplexer 350 may transmit the error check data to the write driver 390 in response to the error check control signal EC_CTRL. The write driver 390 may store the error check data in a memory cell corresponding to any address. The memory cell corresponding to any address may be selected by the row decoder 311 and the column decoder 312. After the error check data are stored in the memory cell corresponding to any address, the read amplifier 390 may read data stored in the memory cell. The comparator 330 may compare data from the read amplifier 390 to the error check data stored in the register 320 and may transmit the comparison result to the read multiplexer 340. The comparison result may be transmitted to the host 20 through the third buffer 363 and the DQ pad. That is, the host 20 may directly check whether an error exists in the memory cell corresponding to any address.

Figure 5:
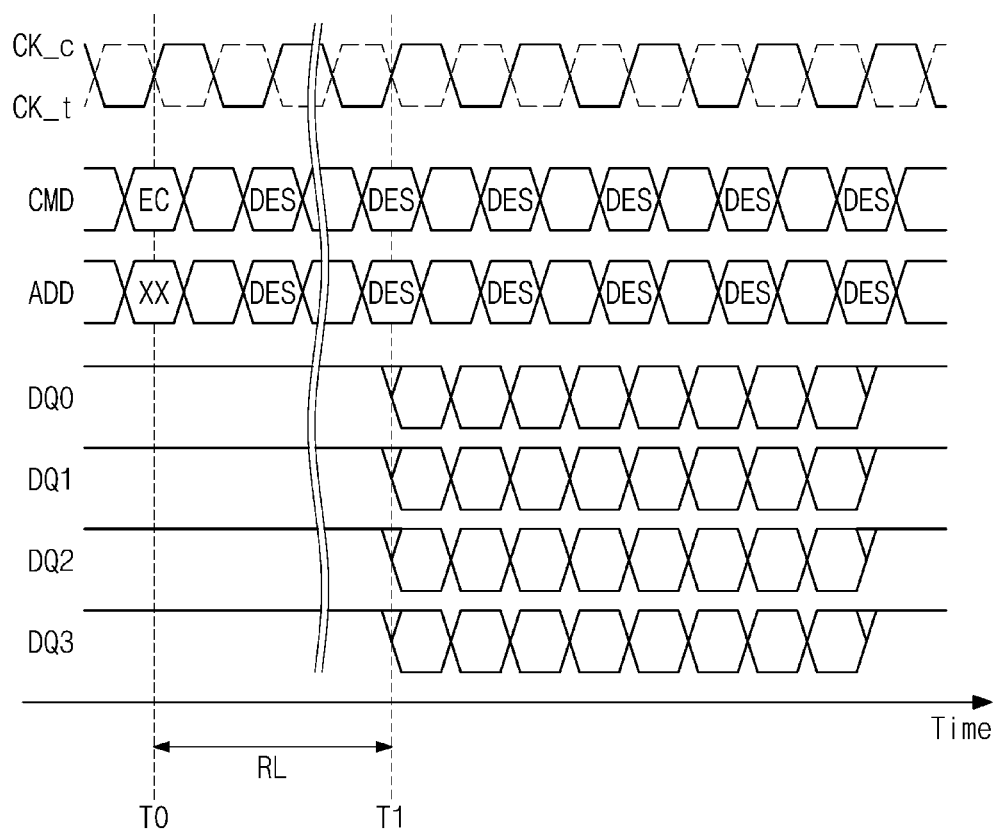
FIG. 5 is a timing diagram for describing an error check operation of a memory device according to example embodiments.

FIG. 5 is a timing diagram for describing an error check operation of a memory device according to example embodiments.

FIG. 5 will be described with reference to FIGS. 1 and 4. In FIG. 5, a horizontal axis represents a time. In FIG. 5, it is assumed that the memory device 300 operates in the x4 mode and a burst length is "8". Here, the burst length may mean the number of bits that are received or output sequentially through a DQ pad when a write operation or a read operation of the memory device 300 is performed. Since the memory device 300 operates in the x4 mode, the memory device 300 may use four DQ pads DQ0 to DQ3.

At a point of time T0, the memory device 300 may receive the error check command EC and any address "XX" from the host 20 (refer to FIG. 1). At a point in time T1, the memory device 300 may output an error check result through the DQ pads DQ0 to DQ3. A time interval between the point in time T0 and the point in time T1 may be viewed as a read latency RL. Here, the read latency may be a time period that is needed for the memory device 300 to check whether an error exists in a memory cell connected to any address "XX" and to output the check result. For example, either "0" or "1" may be output as the error check result. The error check operation of the memory device 300 is described in detail with reference to FIG. 4, and a description thereof is thus omitted.

Figure 6:
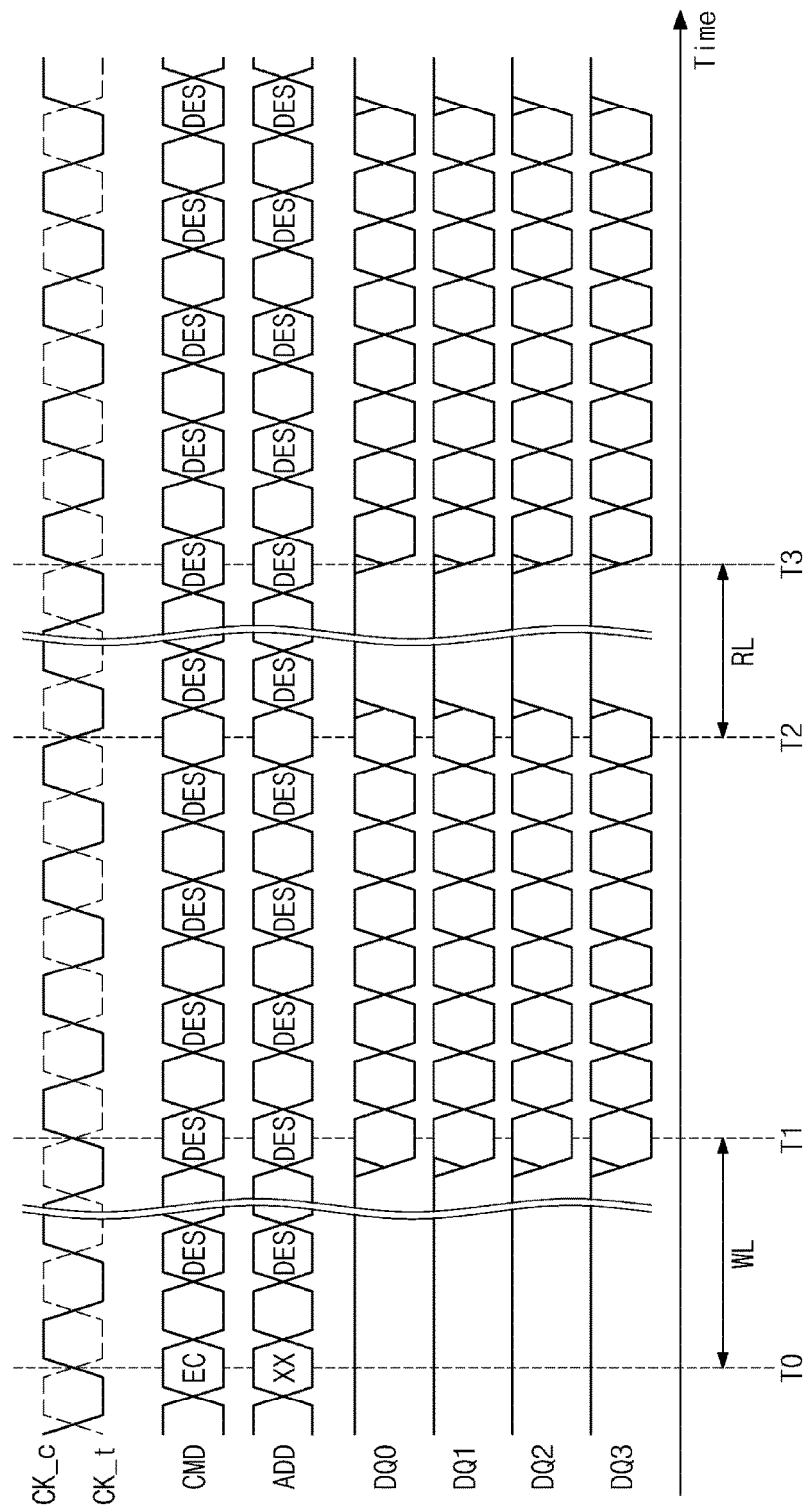
FIG. 6 is a timing diagram for describing an error check operation of a memory device, according to other example embodiments.

FIG. 6 is a timing diagram for describing an error check operation of a memory device according to other example embodiments. FIG. 6 will be described with reference to FIGS. 1, 4, and 5. In FIG. 6, a horizontal axis represents a time. Like that described in FIG. 5, it is assumed in FIG. 6 that the memory device 300 operates in the x4 mode and a burst length is "8".

At a point of time T0, the memory device 300 may receive the error check command EC and any address "XX" from the host 20 (refer to FIG. 1). At a point in time T1, the memory device 300 may receive the error check data through the DQ pads DQ0 to DQ3 from the host 20 (refer to FIG. 1). A time interval between the point in time T0 and the point in time T1 may be viewed as a write latency WL. Here, the write latency may be a time period that is needed to perform a preparation operation necessary to receive the error check data.

At a point in time T2, the memory device 300 is received the whole error check data. Afterwards, at a point in time T3, the memory device 300 may output an error check result through the DQ pads DQ0 to DQ3. As described with reference to FIG. 5, a time interval between the point in time T2 and the point in time T3 may be viewed as the read latency RL. Alternatively, a time interval between the point in time T0 and the point in time T3 may be viewed as the read latency RL. For example, either "0" or "1" may be output as the error check result.

Referring to FIG. 6, the memory device 300 may need the write latency WL to receive data or may need the read latency RL to output data. The latencies may be time periods that are needed due to a characteristic of the memory device 300. The host 20 may perform error check on the memory cell array 310 in various conditions by adjusting the write latency WL or the read latency RL of the memory device 300. A value of each of the write and read latencies may be changed by adjusting timing of signals to be output by the command decoder 370.

Figure 7:
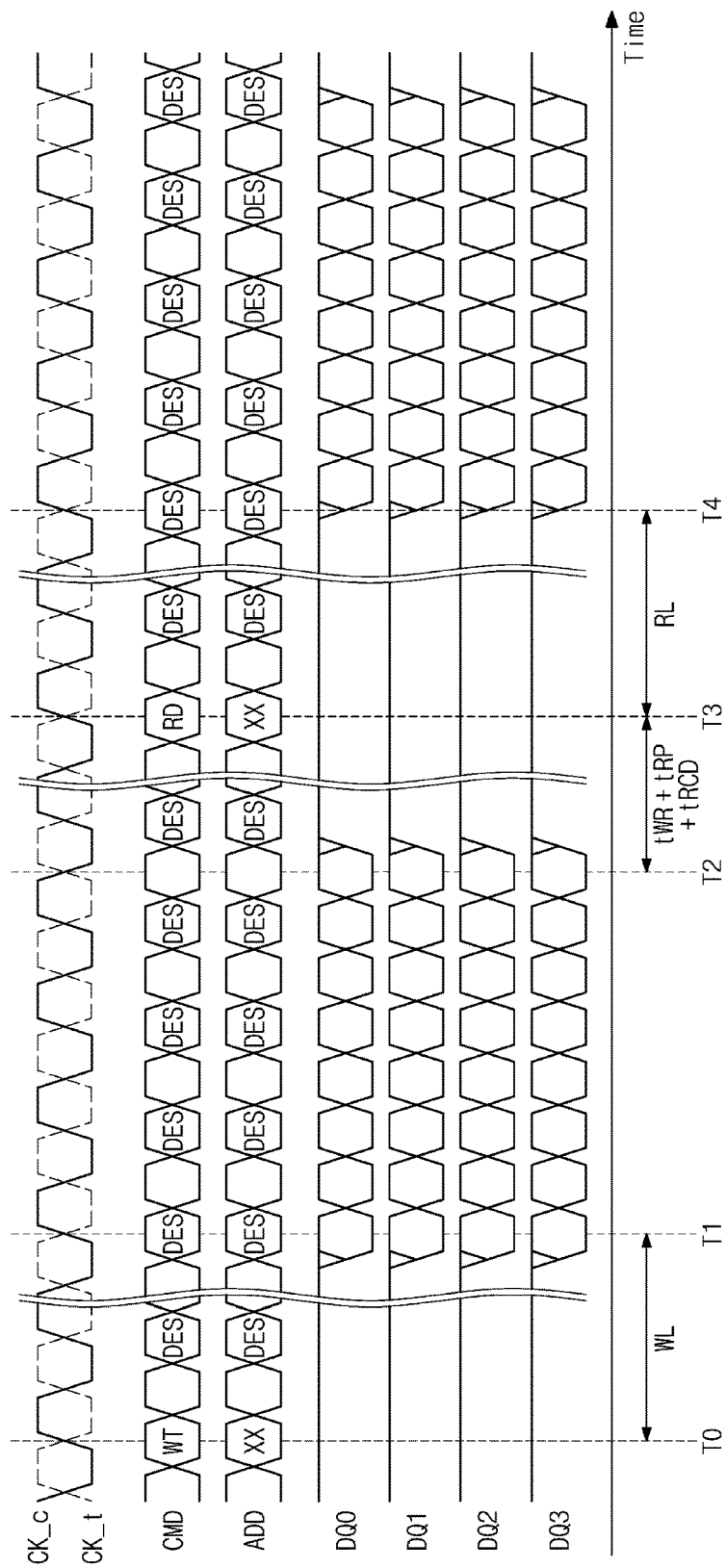
FIG. 7 is a timing diagram for describing an error check operation of a memory device according to still other example embodiments.

FIG. 7 is a timing diagram for describing an error check operation of a memory device according to still other example embodiments. FIG. 7 will be described with reference to FIGS. 1, 4, 5, and 6. In FIG. 7, a horizontal axis represents a time. In FIG. 7, it is assumed that the memory device 300 is a DRAM. In addition, it is assumed that the memory device 300 operates in the x4 mode and a burst length is "8".

At a point of time T0, the memory device 300 may receive a write command WT and any address "XX" from the host 20 (refer to FIG. 1). For example, the memory device 300 may receive an active command before the point in time T0. The error check command EC may be newly defined for error check of the memory device 300. However, the memory device 300 may also perform the error check by using general DRAM commands that are independent of the error check command EC.

At a point in time T1, the memory device 300 may receive write data from the host 20. Here, the write data may mean the error check data. As described with reference to FIG. 6, a time interval between the point in time T0 and the point in time T1 may be viewed as the write latency WL. At a point in time T2, the memory device 300 may be received the whole write data from the host 20.

Although not illustrated in FIG. 7, the memory device 300 may sequentially receive a precharge command and an active command from the host 20 between the point in time T2 and the point in time T3. In this case, a time interval between the point in time T2 and the point in time T3 may correspond to a sum of tWR, tRP, and tRCD. Here, the tWR (write recovery time) may be a time that is needed to write data in the memory cell array 310 before the memory device 300 receives the precharge command. The tRP (row precharge time) may be a time that is needed for the memory device 300 to receive the active command after the precharge command. The tRCD (RAS to CAS delay time) may be a time that is needed for the memory device 300 to receive a write command or a read command after the active command. The above-described tWR, tRP, and tRCD may be times that are needed due to DRAM cell characteristic and structure. The host 20 may check whether an error exists in the memory cell array 310, changing the above-described latency characteristics, such as tWR, tRP, and tRCD.

Unlike the above description, the memory device 300 may not receive the precharge command and the active command from the host 20. In this case, the memory device 300 may receive the read command after a time elapses from the point in time T2.

At a point of time T3, the memory device 300 may receive a read command RD and any address "XX" from the host 20. Afterwards, at a point in time T4, the memory device 300 may output an error check result through the DQ pads DQ0 to DQ3. A time interval between the point in time T3 and the point in time T4 may be viewed as the read latency RL. Either "0" or "1" may be output, for example, as the error check result.

Figure 8:
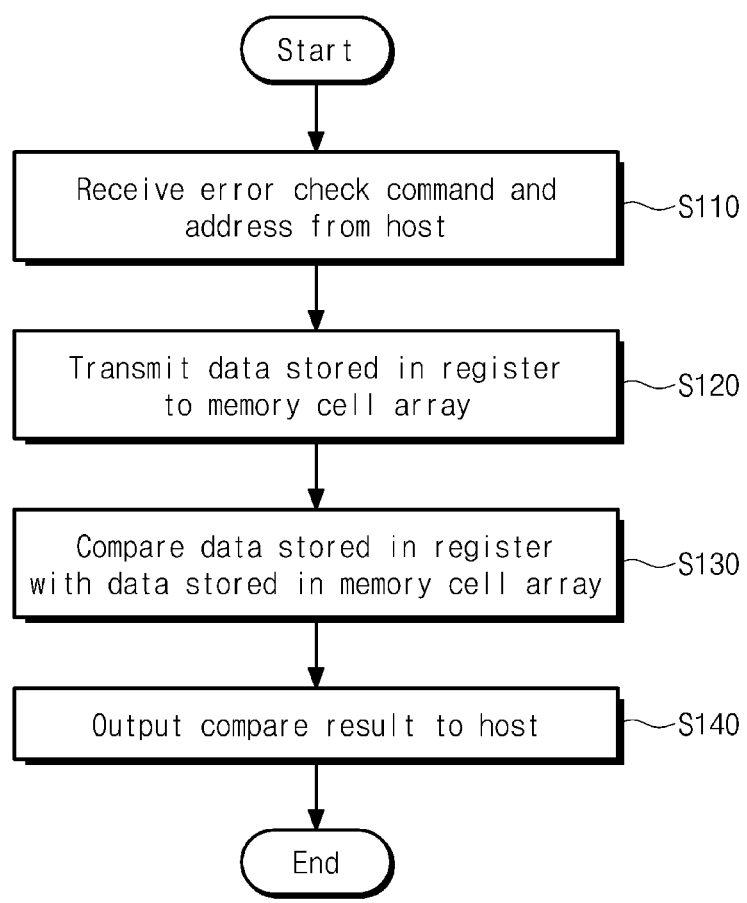
FIG. 8 is a flowchart illustrating an operation sequence of a memory device according to example embodiments.

FIG. 8 is a flowchart illustrating an operation sequence of a memory device according to example embodiments. FIG. 8 will be described with reference to FIGS. 4 and 5.

In operation S110, the memory device 300 may receive the error check command and any address from the host 20. Step S110 may correspond to the point in time T0 illustrated in FIG. 5.

In operation S120, the register 320 may transmit data stored therein to the memory cell array 310. Here, data stored in the register 320 may mean data that are in advance defined for error check.

In operation S130, the comparator 330 may compare data stored in the memory cell array 310 to the data stored in the register 320. The comparison result may include information about whether an error exists in the memory cell array 310.

In operation S140, the memory device 300 may output the comparison result to the host 20. Step S140 may correspond to the point in time T1 illustrated in FIG. 5.

Figure 9:
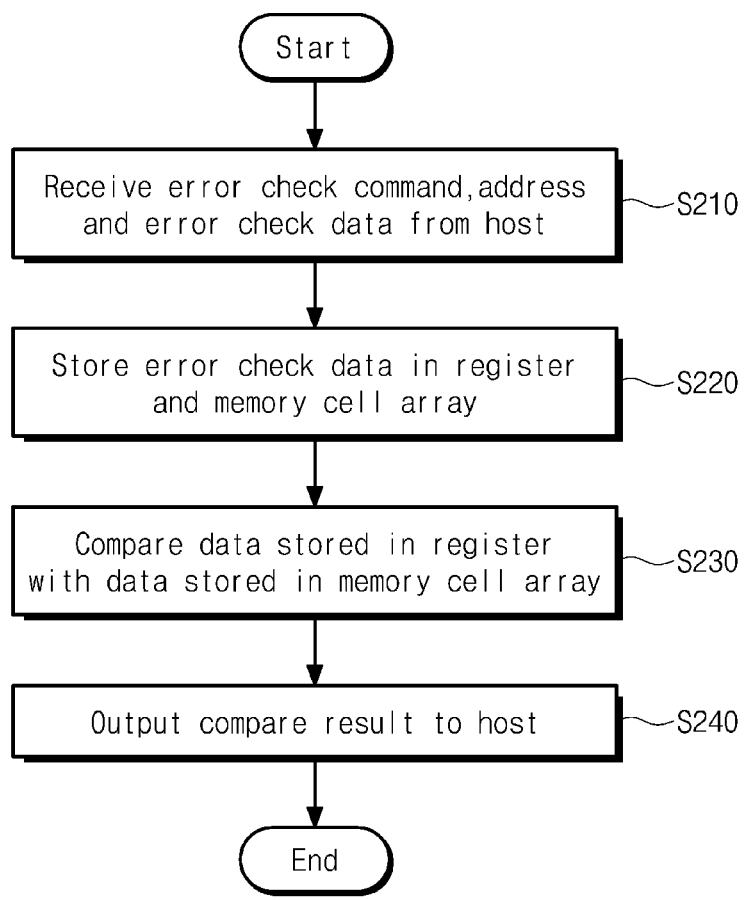
FIG. 9 is a flowchart illustrating an operation sequence of a memory device according to other example embodiments.

FIG. 9 is a flowchart illustrating an operation sequence of a memory device according to other example embodiments. FIG. 9 will be described with reference to FIGS. 4 and 6.

In operation S210, the memory device 300 may receive the error check command, any address, and error check data from the host 20. Step S210 may correspond to the point in time T0 illustrated in FIG. 6.

In operation S220, the error check data may be stored in both the register 320 and the memory cell array 310. The storing of the error check data may be performed between the point in time T2 and the point in time T3 illustrated in FIG. 6. Even before the point in time T2, the storing of the error check data may be performed whenever data are received.

In operation S230, the comparator 330 may compare data stored in the memory cell array 310 to the data stored in the register 320. The comparison may be made between the point in time T2 and the point in time T3 illustrated in FIG. 6. The comparison result may include information about whether an error exists in the memory cell array 310.

In operation S240, the memory device 300 may output the comparison result to the host 20. Step S240 may correspond to the point in time T3 illustrated in FIG. 6.

Figure 10:
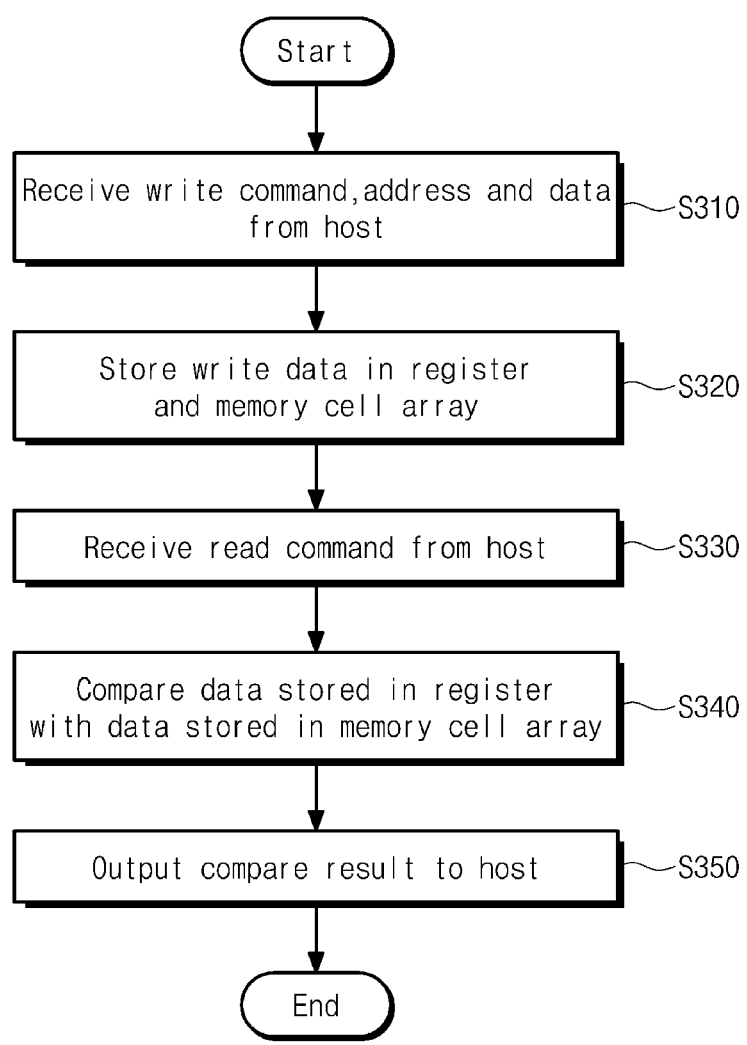
FIG. 10 is a flowchart illustrating an operation sequence of a memory device according to still other example embodiments.

FIG. 10 is a flowchart illustrating an operation sequence of a memory device according to still other example embodiments. FIG. 10 will be described with reference to FIGS. 4 and 7.

In operation S310, the memory device 300 may receive the write command, any address, and write data from the host 20. As described above, the write data may mean the error check data. Step S310 may correspond to a time period between the point in time T0 and the point in time T1 illustrated in FIG. 7.

In operation S320, the write data may be stored in both the register 320 and the memory cell array 310. The storing of the write data may be performed between the point in time T2 and the point in time T3 illustrated in FIG. 7. Even before the point in time T2, the storing of the write data may be performed whenever data are received.

In operation S330, the memory device 300 may receive a read command and any address from the host 20. Step S330 may correspond to the point in time T3 illustrated in FIG. 7.

In operation S340, the comparator 330 may compare data stored in the memory cell array 310 to the data stored in the register 320. The comparison may be made between the point in time T3 and the point in time T4 illustrated in FIG. 7. The comparison result may include information about whether an error exists in the memory cell array 310.

In operation S350, the memory device 300 may output the comparison result to the host 20. Step S350 may correspond to the point in time T4 illustrated in FIG. 7.

Figure 11:
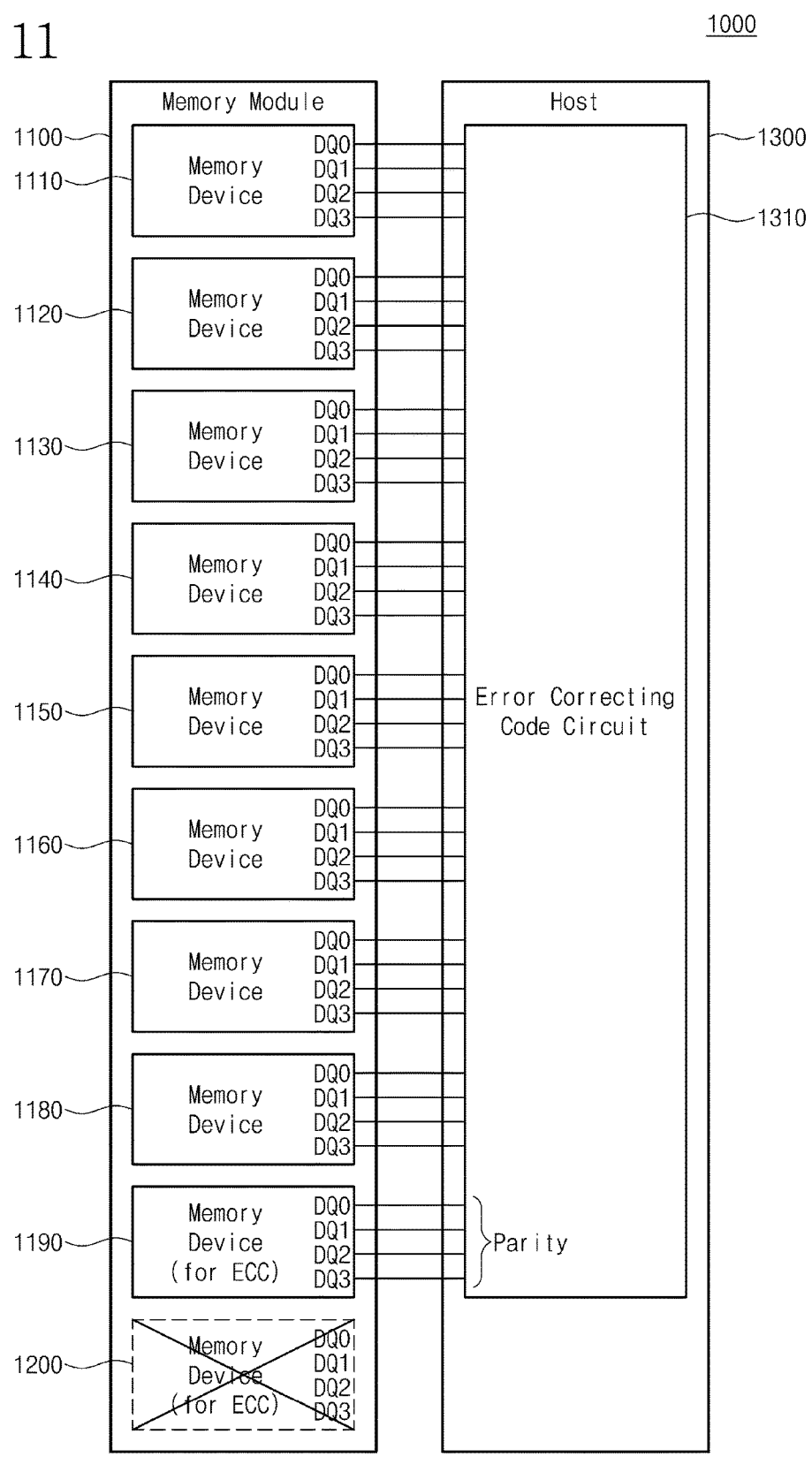
FIG. 11 is a block diagram illustrating a computer system according to other example embodiments.

FIG. 11 is a block diagram illustrating a computer system according to other example embodiments.

Referring to FIG. 11, a computer system 1000 may include a memory module 1100 and a host 1300. The memory module 1100 may include memory devices 1110 to 1190, and the host 1300 may include an error correcting code (ECC) circuit 1310. The host 1300 may include a controller to control elements of the computer system 1000, interfaces, graphics engines, etc. The host 1300 may also include a central processing unit (CPU), a graphic processing unit (GPU), a system on chip (SoC), an application processor (AP), etc. Here, it is assumed that each of the memory devices 1110 to 1190 operates in the x4 mode and uses four DQ pads DQ0 to DQ3.

The memory devices 1110 to 1180 may be used for normal data exchange between the memory module 1100 and the host 1300. The memory device 1190 may store metadata. As described above, the metadata may include data on which the ECC calculation is performed for error correction by the ECC circuit 1310. As described in table 1, since eight memory devices 1110 to 1180 operate in the x32 mode, two memory devices 1190 and 1200 may be used to store the metadata. However, according to the above disclosed embodiments, each of the memory devices 1110 to 1190 may notify the host 1300 whether an error is generated therein. For example, when the first memory device 1110 has an error in data of DQ0 the first memory device 1110 may notify the error to the host 1300, and then ECC circuit 1310 may correct data of the DQ0 of the first memory device 1110 by checking an error location from the first memory device 1110 and using parity data of DQ0 of the memory device 1190. In this case, the size of the metadata may be reduced. Accordingly, the memory module 1100 may include only one memory device 1190 to store the metadata.

The host 1300 may perform parity calculation by using data (i.e., metadata) output from the memory device 1190. Accordingly, the host 1300 may check whether an error is generated in data (i.e., normal data) output from the memory devices 1110 to 1180. However, the memory module 1100 may not include the memory device 1200. Accordingly, the host 1300 may transmit the error check command to the memory module 1100 to check whether an error is generated in any memory device of the memory devices 1110 to 1190. Afterwards, since the host 1300 has check whether an error is generated and an error location, the host 1300 may perform an error correction operation. If an error exists in the memory device 1190 and an error does not exist in the remaining memory devices 1110 to 1180, the host 1300 may not perform the error correction operation because an error does not exist in the normal data.

Figure 12A:
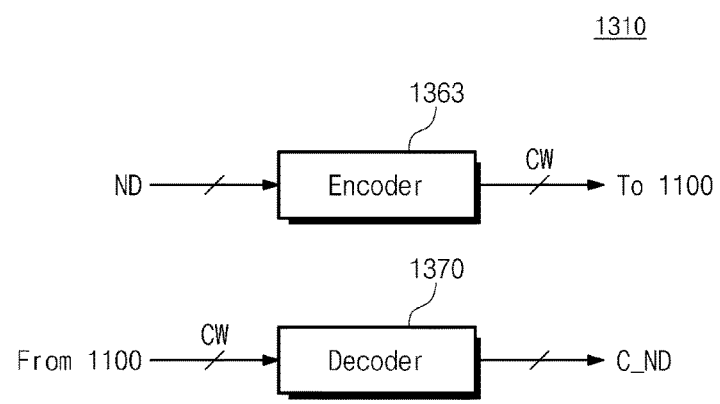
FIG. 12A illustrates the ECC circuit 1310 shown in the host 1300 of FIG. 11 according to example embodiments.

FIG. 12A illustrates the ECC circuit 1310 shown in the host 1300 of FIG. 11 according to example embodiments.

Referring to FIG. 12A, the ECC circuit 1310 may include an encoder 1363 and a decoder 1370. The encoder 1363, in a write operation, the encoder 1363 encodes a normal data ND to generate a parity data and provides the memory module 1100 with a write codeword CW including the normal data ND and the parity data. The decoder 1370, in a read operation, may receive a read codeword CW and correct a single-bit error in the normal data ND using the parity data. Also, decoder 1370, in a read operation, may correct a single-bit error in the normal data ND or the parity data.

Figure 12B:
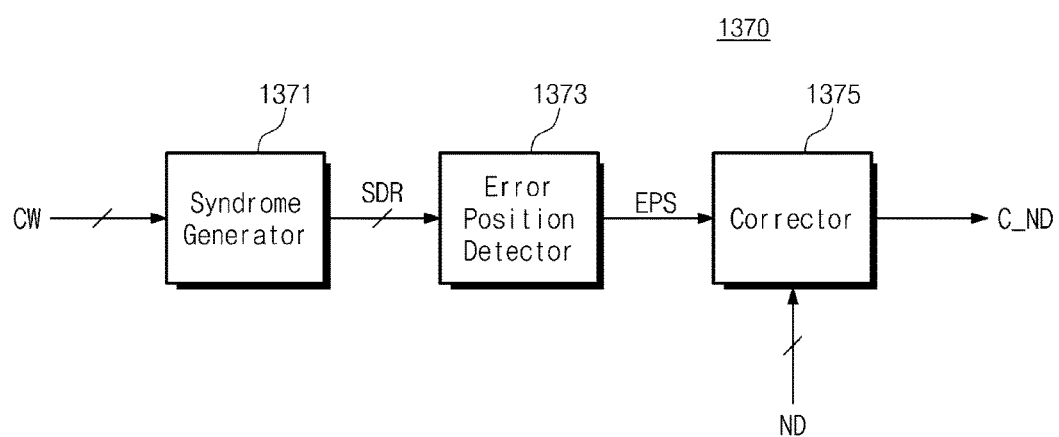
FIG. 12B is a block diagram illustrating the decoder shown in the ECC circuit of FIG. 12A, according to example embodiments.

FIG. 12B is a block diagram illustrating the decoder shown in the ECC circuit of FIG. 12A, according to example embodiments.

Referring to FIG. 12B, the decoder 1370 may include a syndrome generator 1371, an error position detector 1373 and an error corrector 1375. The syndrome generator 1371 may generate syndromes SDR based on the read codeword CW. The error position detector 1373 may detect a position of errors in the normal data ND based on the syndromes SDR to generate an error position signal EPS. For example, the error position detector 1373 may calculate coefficients of error position polynomial using two or more syndromes SDR and may detect the error position to generate the error position signal EPS based on the coefficients. The error corrector 1375 may correct errors in the normal data ND based on the error position signal EPS to provide the corrected normal data C_ND.

Figure 13:
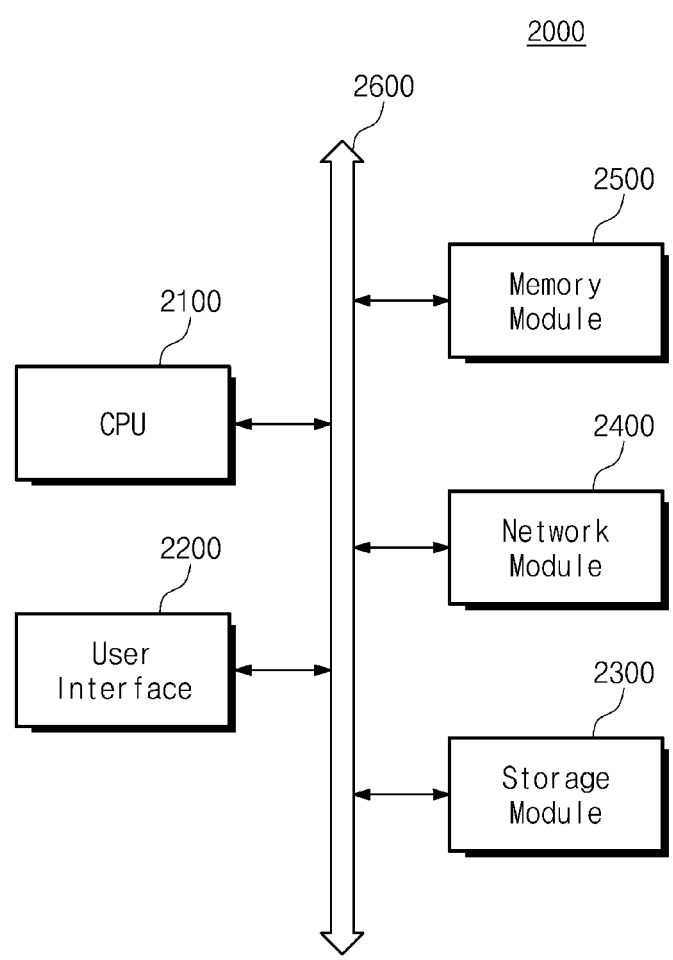
FIG. 13 is a block diagram illustrating a computer system according to other example embodiments.

FIG. 13 is a block diagram illustrating a computer system according to other example embodiments. Referring to FIG. 13, a computer system 2000 may include a CPU 2100, a user interface 2200, a storage module 2300, a network module 2400, a memory module 2500, and a system bus 2600.

The CPU 2100 may drive elements and an operating system of the computer system 2000. In an embodiment, the CPU 2100 may include controllers for controlling elements of the computer system 2000, interfaces, graphics engines, etc. The CPU 2100 may be a system-on-chip (SoC). A graphics processing unit may be used in the computer system 2000 instead of the CPU 2100.

The user interface 2200 may include interfaces which input data or an instruction to the CPU 2100 or output data to an external device. In an embodiment, the user interface 2200 may include user input interfaces such as a keyboard, a keypad, buttons, a touch panel, a touch screen, a touch pad, a touch ball, a camera, a microphone, a gyroscope sensor, and a vibration sensor, and a piezoelectric element. The user interface 2200 may further include interfaces such as a liquid crystal display (LCD), an organic light-emitting diode (OLED) display device, an active matrix OLED (AMOLED) display device, a light-emitting diode (LED), a speaker, and a motor.

The storage module 2300 may store data. For example, the storage module 2300 may store data received from the CPU 2100. Alternatively, the storage module 2300 may transfer data stored therein to the CPU 2100. In an embodiment, the storage module 2300 may be implemented with a nonvolatile memory device such as an electrically programmable read only memory (EPROM), a NAND flash memory, a NOR flash memory, a PRAM, a ReRAM, a FeRAM, an MRAM, or a TRAM. The storage module 2300 may be a memory module according to an embodiment of the inventive concept.

The network module 2400 may communicate with external devices. In an embodiment, the network module 2400 may support wireless communications, such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless LAN (WLAN), ultra wide band (UWB), Bluetooth, and wireless display (WI-DI).

The memory module 2500 may operate as a main memory, a working memory, a buffer memory, or a cache memory of the computer system 2000. The memory module 2500 may include volatile memories such as a DRAM and an SRAM or nonvolatile memories such as a NAND flash memory, a NOR flash memory, a PRAM, a ReRAM, a FeRAM, an MRAM, and a TRAM. The memory module 2500 may be a memory module described example embodiments.

The system bus 2600 may electrically connect the CPU 2100, the user interface 2200, the storage module 2300, the network module 2400, and the memory module 2500.

According to an embodiment of the inventive concept, a memory device may check whether an error is generated in a memory cell. A memory module according to an embodiment of the inventive concept may reduce the number of additional memory devices for improving reliability of the memory cell.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A memory module comprising:
    a plurality of first memory devices configured to store normal data; and
    a plurality of second memory devices configured to store parity data about the normal data of the plurality of first memory devices,
    wherein each memory device of the plurality of first and second memory devices includes a memory cell array and a register configured to store error check data for checking read data of the memory cell array and outputs a result of comparing the read data with the error check data,
    wherein a total number of data input/output pads of the plurality of first memory devices is $2^k$, k being a natural number, and
    wherein a total number of data input/output pads of the plurality of second memory devices is less than (k+1).

2. The memory module of claim 1, wherein each of the plurality of second memory devices is the same as each of the plurality of first memory devices.

3. The memory module of claim 1, wherein each memory device of the plurality of first and second memory devices further comprises:
    a comparator configured to compare the read data with the error check data.

4. The memory module of claim 3, wherein each memory device of the plurality of first and second memory devices further comprises:
    a read multiplexer configured to output the read data received from the memory cell array or to output a comparison result of the comparator.

5. The memory module of claim 4, wherein the read multiplexer is further configured to output the error check data of the register.

6. The memory module of claim 5, wherein each memory device of the plurality of first and second memory devices further comprises:
a write multiplexer configured to selectively output write data received from outside the memory module or the error check data of the register to the memory cell array.

7. The memory module of claim 6,
wherein a respective register, comparator, read multiplexer, and write multiplexer of each of the plurality of first and second memory devices correspond to a respective data input/output pad of each of the plurality of first and second memory devices.

8. A memory module comprising:
a plurality of first memory devices configured to store normal data; and
a plurality of second memory devices configured to store parity data about the normal data of the plurality of first memory devices,
wherein each memory device of the plurality of first and second memory devices includes a memory cell array and a register configured to store error check data for checking read data of the memory cell array and output a result of comparing the read data with the error check data,
wherein a total number of bits of the normal data is $2^k$, k being a natural number, and
wherein a total number of bits of the parity data is less than (k+1).

9. The memory module of claim 8, wherein each of the plurality of second memory devices is the same as each of the plurality of first memory devices.

10. The memory module of claim 8, wherein each memory device of the plurality of first and second memory devices further comprises:
a comparator configured to compare the read data with the error check data.

11. The memory module of claim 10, wherein each memory device of the plurality of first and second memory devices further comprises:
a read multiplexer configured to output the read data received from the memory cell array or to output a comparison result of the comparator.

12. The memory module of claim 11, wherein the read multiplexer is further configured to output the error check data of the register.

13. The memory module of claim 12, wherein each memory device of the plurality of first and second memory devices further comprises:
a write multiplexer configured to selectively output write data received from outside the memory module or the error check data of the register to the memory cell array.

14. The memory module of claim 13, wherein a respective register, comparator, read multiplexer, and write multiplexer of each of the plurality of first and second memory devices correspond to a respective data input/output pad of each of the plurality of first and second memory devices.

* * * * *